(12) United States Patent
Svendsen et al.

(10) Patent No.: US 9,170,642 B2
(45) Date of Patent: Oct. 27, 2015

(54) DYNAMIC POWER CONTROL

(71) Applicants: Kjeld P. Svendsen, Sunnyvale, CA (US); Arun Jangity, Sunnyvale, CA (US)

(72) Inventors: Kjeld P. Svendsen, Sunnyvale, CA (US); Arun Jangity, Sunnyvale, CA (US)

(73) Assignee: Applied Micro Circuits Corporation, Santa Clara, CA (US)

(*) Notice: Subject to any disclaimer, the term of this patent is extended or adjusted under 35 U.S.C. 154(b) by 321 days.

(21) Appl. No.: 13/848,377

(22) Filed: Mar. 21, 2013

(65) Prior Publication Data
US 2014/0289541 A1    Sep. 25, 2014

(51) Int. Cl.
| G06F 1/00 | (2006.01) |
| G06F 1/04 | (2006.01) |
| G06F 1/26 | (2006.01) |
| G06F 1/32 | (2006.01) |
| H03L 3/00 | (2006.01) |

(52) U.S. Cl.
CPC .............. G06F 1/3296 (2013.01); G06F 1/26 (2013.01); G06F 1/324 (2013.01); G06F 1/3206 (2013.01); H03L 3/00 (2013.01)

(58) Field of Classification Search
CPC ................................. G06F 1/3296; H03L 3/00
USPC .......................... 713/300, 320, 322, 600, 601
See application file for complete search history.

(56) References Cited

U.S. PATENT DOCUMENTS

| 4,596,026 | A  | * | 6/1986  | Cease et al. ................... 375/372 |
| 7,290,156 | B2 | * | 10/2007 | Gaskins ......................... 713/322 |
| 7,739,535 | B2 | * | 6/2010  | Ha et al. ......................... 713/500 |
| 7,886,131 | B1 | * | 2/2011  | Kang .............................. 713/300 |
| 7,962,770 | B2 |   | 6/2011  | Capps, Jr. et al. |
| 8,037,334 | B2 |   | 10/2011 | Samson et al. |
| 8,127,157 | B2 |   | 2/2012  | Bilak |
| 8,174,329 | B2 |   | 5/2012  | Goodnow et al. |
| 8,245,057 | B2 | * | 8/2012  | Lyu ............................... 713/322 |
| 8,307,224 | B2 |   | 11/2012 | Conroy et al. |
| 8,819,463 | B2 | * | 8/2014  | Burchard et al. ............. 713/322 |
| 2011/0113269 | A1 | * | 5/2011 | Park .............................. 713/310 |
| 2011/0320839 | A1 | * | 12/2011 | David et al. ................... 713/322 |
| 2014/0006831 | A1 | * | 1/2014 | Keish et al. ................... 713/324 |

* cited by examiner

*Primary Examiner* — Mark Connolly
(74) *Attorney, Agent, or Firm* — Amin, Turocy & Watson, LLP

(57) ABSTRACT

Systems and methods are provided that facilitate power management in a processing device. The system contains a power management component and a coupled to the processing device. The power management component determines and input rate and target voltages and/or frequency. The power management component can scale voltages and/or frequencies based on target voltages and/or frequencies. Accordingly, power consumption can be reduced and processing devices can be more efficient.

20 Claims, 10 Drawing Sheets

DYNAMIC POWER CONTROL

FIELD

This disclosure relates to dynamic power control systems and/or methods, and more particularly to efficient request based frequency and voltage scaling at a microchip level.

BACKGROUND

Management of power consumption is important in electronic devices (e.g., battery-powered devices) such as laptop and notebook computer systems, cell phones, tablet computers, personal digital assistants (PDAs), portable media players, remote control units, hand-held devices including video game players, memory device, and the like. Consumers are increasingly demanding that these electronic devices use power efficiently.

However, many electronic devices may be used for a variety of computationally intensive applications such as three-dimensional (3D) rendering and video encoding and decoding, and the like. As a result, such devices can usually be used for limited periods of time.

Power dissipation (P) of a device is dependent on capacitance (C), clock frequency (f) and supply voltage (V), with $P=CfV^2$. The upper limit of the clock frequency is determined by supply voltage. Accordingly, a reduction in the supply voltage results in corresponding reduction in power dissipation. Additionally, reduced supply voltage of a device results in an increase in delay through the device.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular implementations of the specification, or any scope of the claims. Its purpose is to present some concepts of the specification in a simplified form as a prelude to the more detailed description that is presented in this disclosure.

In an implementation, a processing unit, such as a central processing unit (CPU), microprocessor, non-transitory signal processor, memory controller, and or other device process requests or a series of requests. Requests are made by one or more applications, components, and the like. As requests are input, a bandwidth requirement can be determined. In an aspect, requests can be stored in a buffer as they wait processing.

In an aspect, a voltage regulator can consist of one or more capacitors, amplifiers, buck converts and the like. The voltage regulator can scale a voltage, supplied to a processing unit for example. In one implementation, the voltage regulator determines an input rate of requests and scales the voltage according to the input rate. In an aspect, the voltage regulator can operate independent of applications.

In one implementation, a frequency regulator can comprise circuitry to scale a frequency (e.g., synthesize a frequency). The frequency regulator can comprise a phase-locked loop (PLL), filters, charge pumps, voltage controlled oscillators, and the like. The frequency regulator can scale a frequency and communicate the scaled frequency to a processing unit for example. In one implementation, the frequency regulator determines an input rate of requests and scales the frequency according to the input rate. In an aspect, the voltage regulator can operate independent of applications.

In another implementation, an input component can store input requests, for examples in tables, queues, and the like. In an aspect, the input component can determine an input rate and communicate the input rate with the one or more components.

Accordingly, latency associated processing and/or accessing memory can be decreased, traffic over a bandwidth can be reduced, overhead can be reduced, power consumption can be reduce, heat generation can be reduced, and/or other aspects of efficiency can be increased. In another aspect, power management can be altered at a fine grain scale.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, implementations, and advantages of the present invention will be apparent upon consideration of the following detailed description, taken in conjunction with the accompanying drawings, in which like reference characters refer to like parts throughout, and in which.

DETAILED DESCRIPTION

Figure 1:
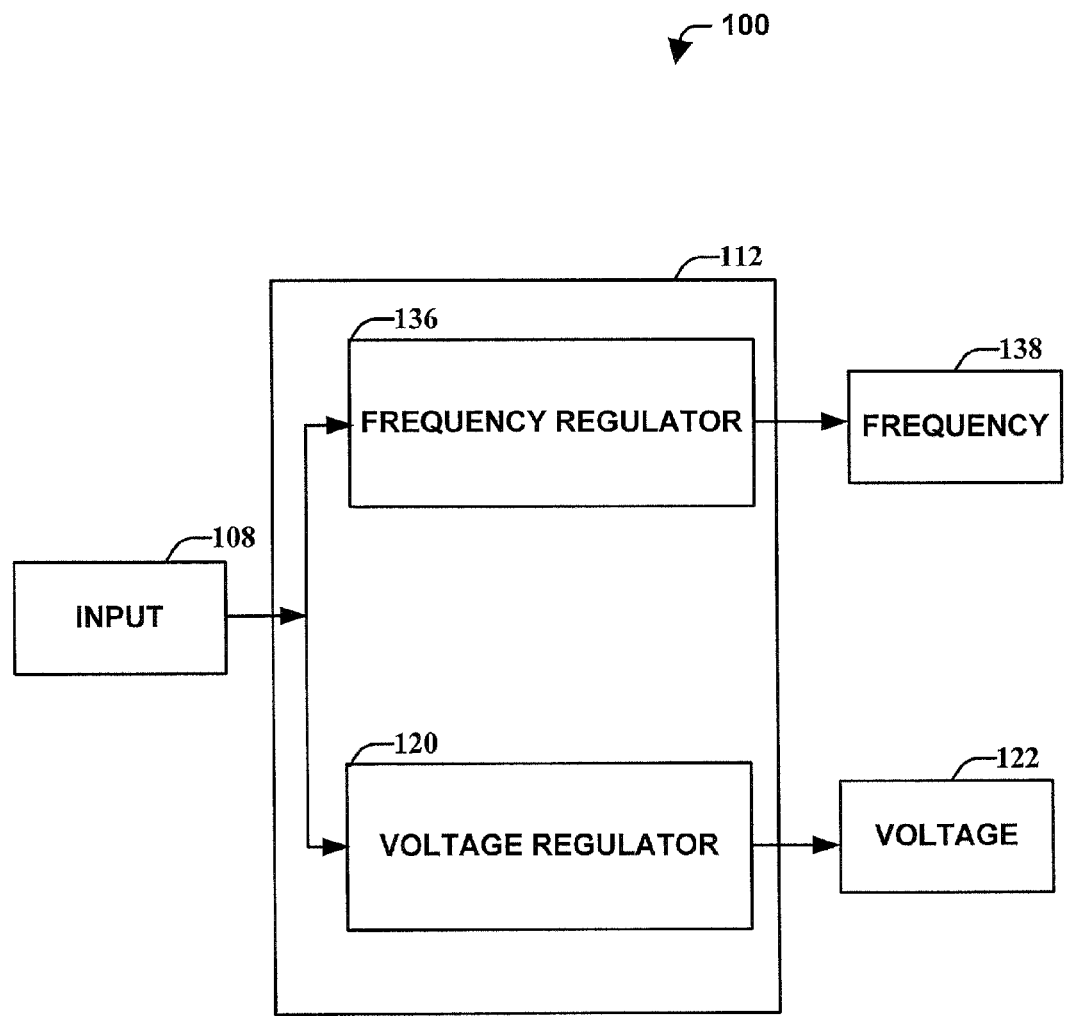
FIG. 1 illustrates a high-level functional block diagram of an example power management system in accordance with various aspects of this disclosure.

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing this disclosure.

Systems and methods disclosed herein relate to power management in variable input rate devices and/or systems. In one implementation, an input component (e.g., a buffer) receives input and determines an input rate based on the received input. In an aspect, the input rate alters a frequency and a voltage of a device to efficiently manage power consumption. It is appreciated that a variable input rate system can be within larger devices such as smart phones, tablets, e-readers, digital video recorders, mobile music players, personal computers, servers, memory sticks, digital video recorders (DVRs), solid state machines, consumer electronics and the like.

Variable input rate systems, in accordance with various aspects of this disclosure, benefit from lower power consumption, low heat generation, and increased efficiency. Scaling a frequency and voltage at a fine grain can reduce power consumption, heat generation, bandwidth requirements, and the like. Further, altering power settings (e.g., voltage and frequency) based on an input rate can increase efficiency According to one aspect of this disclosure, applications (e.g., software in operation) send requests to a processing unit(s). The processing unit receives the requests as input. As a number of requests alter, a corresponding input rate can alter. In accordance with an aspect, a processing unit can process each request. When an input rate increases, the processing unit can require higher voltages and/or frequencies in order to manage latency and/or processing speed. In another aspect, a decrease input rate can result in a processing unit requiring a reduce need for power.

According to various aspects of this disclosure, a variable input rate system can comprise one or more components requiring power. In an aspect, a variable rate system can determine an input rate and scale voltages and/or frequencies for one or more components.

In an aspect, scaling voltages and/or frequencies can be based on a type of request. In an example, an input rate can be determined for individual types of requests. As an example, input rates for memory read and/or write requests can be determined. Additionally, an input rate for processing requests can be determined. A voltage and/or frequency can be scale for a memory device based on the input rate for the for memory read and/or write requests, and a separate voltage and/or frequency can be scale for a processing unit based on the input rate for the for processing requests In this disclosure various systems and methods generally refer to a processors, processing units, memory, memories, a memory device(s), variable input rate device(s), or the like are generally intended to refer to a computer-related entity, either hardware (e.g., a circuit), a combination of hardware and software, and/or an entity storing data, electronically, optically, mechanically or otherwise. For example, a memory may be, but is not limited to being, an electronic memory device storing non-transitory signals via a combination of circuitry and control algorithms.

Generally, the various systems and methods apply to electronic devices receiving a variable input rate and/or systems and methods having a variable input rate. The terms "variable input rate," "variable request rate," "variable processing rate," and the like are used interchangeably, unless context suggests otherwise. The terms can refer to a rate (of input, request, etc.) that changes over time.

Referring now to FIG. 1, there is illustrated a non-limiting exemplary implementation of a system 100 that provides power management and frequency and/or voltage scaling in accordance with various aspects of this disclosure. The system 100 can comprise a power management component 112 that can comprise a voltage regulator 120 and a frequency regulator 136. The management component 112 can receive input 108. Input can include one or more suitable requests, such as a processing request, and/or memory access request, for example. However, it is noted that input can comprise an input rate, bandwidth requirement, and/or other metrics. The voltage regulator 120 can receive the input 108 and output a voltage 122. The frequency regulator 136 can receive the input 108 and output a frequency 138.

In one implementation, the various components may be contained on one integrated circuit, or on a number of individual circuits coupled together. In an aspect, the voltage regulator 120 and/or the frequency regulator 136 are comprised on a microchip with additional components, e.g., such as a processing unit, for example.

The voltage regulator 120 can include one or more voltage regulators, comprising capacitors, gates, resistors, amplifiers, buck converts, and the like. In an aspect, the voltage regulator 120 can receive the input 108 and scale a voltage according to an input rate of the input 108. In one aspect, the voltage regulator 120 can determine the input rate of the input 108 based on a relative time of received input. However, it is noted that the input 108 can comprise an input rate.

In one implementation, the voltage regulator 120 can determine a target voltage based on the input rate of the input 108. The voltage regulator 120 can scale a voltage to the target voltage. The target voltage is a value and/or a range of values to be scaled to for power management. In an aspect, the voltage regulator 122 can scale a voltage supplied by a power source.

In an implantation, the voltage regulator 120 can output the voltage 122. The voltage 124 can be output to various components, for example, to a processing unit. Further, the voltage regulator 120 can be coupled to the various components.

The frequency regulator 136 can include one or more frequency regulators, comprising capacitors, gates, resistors, oscillators, phase detectors, amplifiers, phase-locked loop (PLL), and the like. In an aspect, the frequency regulator 136 can receive the input 108 and scale a frequency according to an input rate of the input 108. In one aspect, the frequency regulator 136 can determine the input rate of the input 108 based on a relative time of received input. In an example, the input 108 can comprise an input rate. It is noted that "a frequency regulator," as used herein, can refer to a frequency synthesizer, and the like.

In one implementation, the frequency regulator 136 can determine a target frequency based on the input rate of the input 108. The frequency regulator 136 can scale a frequency to the target frequency. The target frequency is a value and/or a range of values to be scaled to for power management. In an aspect, the frequency regulator 136 can scale a frequency supplied by various components.

In an aspect, the frequency regulator 136 generates the frequency 138 with a phase related to an input signal (e.g., reference signal). In an aspect, the frequency regulator compares a phased of the input signal with the phased of a signal from an output oscillator and scales a frequency of an oscillator to keep the phases matched. In another aspect, the frequency regulator 136 can utilize an input rate of the input 108 to generate a reference signal. In an aspect, the frequency 138 can be a multiple of an input frequency. It is noted that a reference signal can be determined based on an input rate, can be comprised in the input 108, and/or determined by various components not shown in system 100.

In an implantation, the frequency regulator 136 can output the frequency 138. The frequency 138 can be output to various components, for example, to a processing unit. Further, the frequency regulator 136 can be coupled to the various components.

In one implementation, the voltage regulator 120 and the frequency regulator 136 scale the voltage and the frequency, respectively, to efficiently manage power. For example, an input rate of the input 108 can be altered and the voltage regulator 120 and the frequency regulator 136 can scale the voltage and frequency according to the altered input rate. In an aspect, the voltage regulator 120 and the frequency regulator 136 increased the voltage and frequency as the input rate increases, and decrease the voltage and frequency as the input rate decreases.

In an implementation, the system 100 can scale a voltage and/or frequency independent (e.g., blind, transparent, etc.) of software running on a larger system. As described in detail herein, scaling a voltage and/or frequency independent and/or blind of software applications can include scaling the voltage and/or frequency without regard for software in execution, without aid of software applications, regardless of what requests are sent to the system 100, and the like. For example, software applications on a system can send various requests as the input 108. In some systems, a software application manage power by sending requests to alter a frequency and/or voltage. The system 100 can alter a frequency and/or voltage automatically at a chip level, without software application management of power. In an aspect, the system 100 can alter a frequency and/or voltage on a much finer scale and in real time and/or near real time. However, it is noted that the system 100 can manage power in conjunction with software applications managing power.

Figure 2:
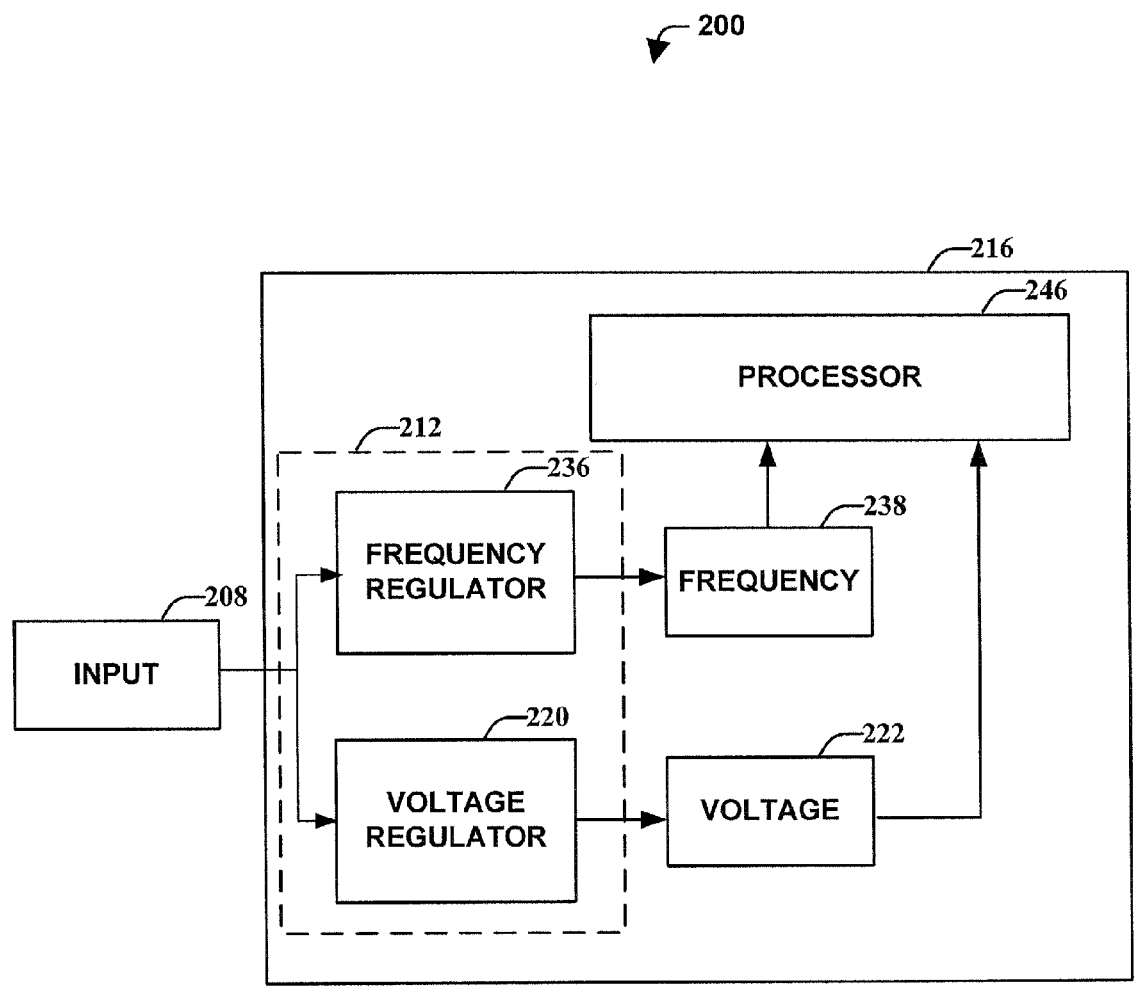
FIG. 2 illustrates a high-level functional block diagram of an example power management system including a processor in accordance with various aspects of this disclosure.

Turning to FIG. 2, there is illustrated a non-limiting exemplary implementation of a system 200 that provides power management and frequency and/or voltage scaling in accordance with various aspects of this disclosure. The system 200 can comprise a processing device 216 that can comprise a power management component 212 and a processor 246. The power management component 212 can comprise a voltage regulator 220 and a frequency regulator 236. While FIG. 2 illustrates a processing unit, the system 200 can comprise a multi-core processing unit, a memory controller, and the like. For example, processing device 216 can be a memory controller.

In an aspect, the voltage regulator 220 and the frequency regulator 236 can function substantially similar to the voltage regulator 120 and the frequency regulator 136, respectively. Likewise, input 208 can comprise an input, a series of input, requests, input rates, and the like.

In an implementation, the voltage regulator 220 receives input and scales a voltage according to the input. In an aspect, the voltage regulator 220 can determine an input rate and scales a voltage from a first voltage to a second voltage. In an aspect, the second voltage can be a target voltage. In one implementation, the voltage regulator 220 can scale a voltage at a set interval and/or a variable interval. For example, the voltage regulator 220 can scale a voltage every K clock cycles, where K is a number. In another example, the voltage regulator 220 can scale a voltage upon occurrence of a triggering event. A triggering event can be receiving an input, a change in input rate, a passage of an interval, and the like. In another example, the voltage regulator 220 can scale a voltage once every triggering event and/or if a triggering event does not occur every K clock cycles, then at every K clock cycles.

It is noted that various combinations and/or triggers can be utilized and this disclosure is not limited to the described examples.

In another implementation, the voltage regulator 220 can determine input rate variation thresholds. In an aspect, an input rate variation threshold can comprise a range of input rates. In an example, the voltage regulator 220 can determine whether or not to scale a voltage if an input rate exceeds the input rate variation threshold. For example, an input rate variation threshold can comprise a range of input rates from M to N, where M and N are numbers. If an input range remains between M and N, the voltage regulator 220 can refrain from scaling a voltage. If an input rate exceeds M or N, the voltage regulator can determined to scale a voltage.

In an implementation, the frequency regulator 236 receives input and scales a frequency according to the input. In an aspect, the frequency regulator 236 can determine an input rate of the input and scale a frequency from a first frequency to a second frequency. In an aspect, the second frequency can be a target voltage. It is noted that the frequency regulator 236 can scale a frequency at a set interval and/or a variable interval, based on triggering events, and or according to an input rate variation threshold.

In an implementation, the voltage regulator 220 and the frequency regulator 236 can generate a voltage 222 and a frequency 238, respectively. The voltage 222 and the frequency 238 can be communicated to the processor 246. In an aspect, a power supplied to the processor 246 can be altered according to the voltage and/or frequency. In an aspect, the system 200 can reduce overall power consumption, increase efficiency, decrease heat generation, and improve other metrics as compared with prior systems.

Figure 3:
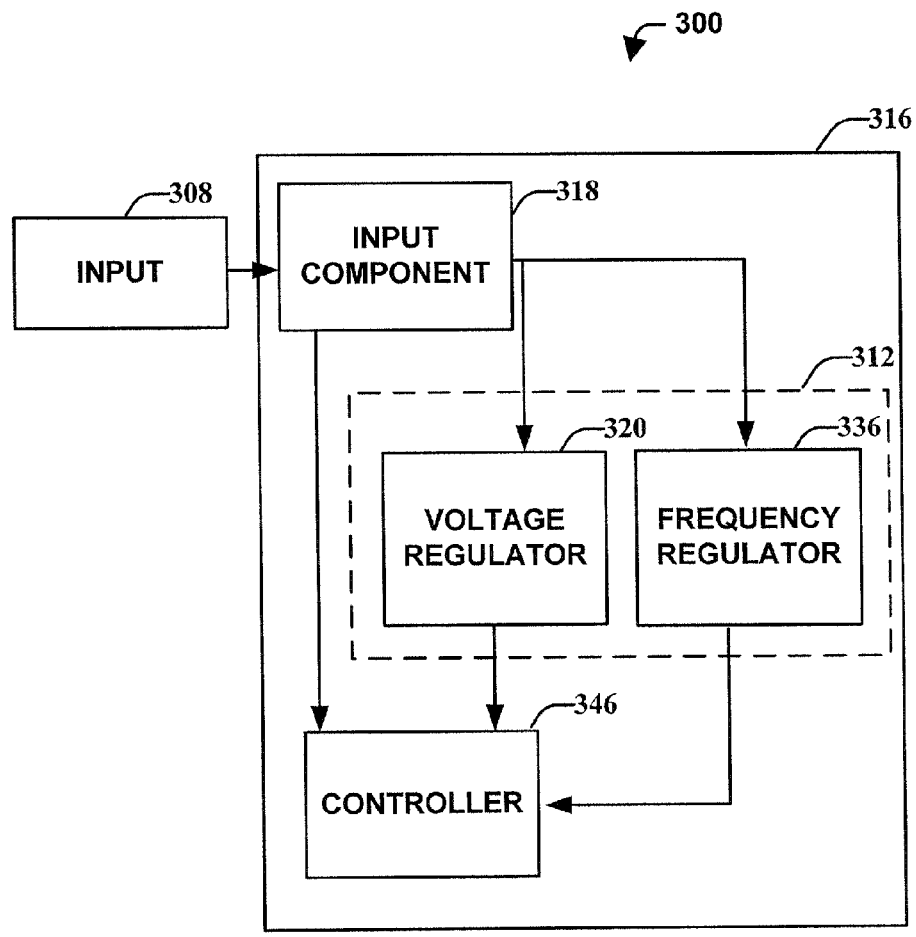
FIG. 3 illustrates a high-level functional block diagram of an example power management system, including a controller an input component in accordance with various aspects of this disclosure.

Referring to FIG. 3, there is illustrated a non-limiting exemplary implementation of a system 300 that provides power management and frequency and/or voltage scaling in accordance with various aspects of this disclosure. The system 300 can comprise a controller device 316 that can comprise a power management component 312, a controller 346, and an input component 318. The power management component 312 can comprise a voltage regulator 320 and a frequency regulator 336. While FIG. 3 illustrates a control unit, the system 300 can comprise a processing unit, and the like. In an aspect, the voltage regulator 320 and the frequency regulator 336 can function substantially similar to the voltage regulators 120, 220, the frequency regulators 136, 236. It is noted that the controller device 316 can comprise a memory controller, a processing unit, and the like.

In an implementation, the input component 318 can receive input from various system components. The input component 318 can store input as entries. The entries can wait for processing by the controller 346. In an aspect, the input buffer can comprise one or more tables, queues, stacks, and the like. It is noted that the input component can store representations and/or data related to the input 308. As an example, the input component can monitor input and store a count of received requests, time markers related to the requests, and the like.

In various implementations, the input component 318 can determine an input rate based on received times of the input 308. In another aspect, the input component 318 can determine an input rate based on stored entries in the input component 318. As an example, an input rate can be represented by number (e.g., number of received requests over a time), a marker (high, low, etc.), and the like.

In an aspect, the input component 318 can communicate with various system 300 components. As an example, the input component 318 can communicate an input rate to the voltage regulator 320 and/or the frequency regulator 336.

However, it is noted that the voltage regulator 320 and/or the frequency regulator 336 can monitor input (e.g., as received, and/or stored) and determine an input rate. In another example, the input component 318 can communicate the input 308 to the controller 346.

It is noted that the various component of system 300 are depicted as separate entities for illustrative purposes. As such, aspects of the various components can be comprised in a single component. For example, the voltage regulator 320 can comprise the input component 318. It is further noted that the voltage regulator 320, the frequency regulator 326, and the input component 318, can be on-chip components.

Figure 4:
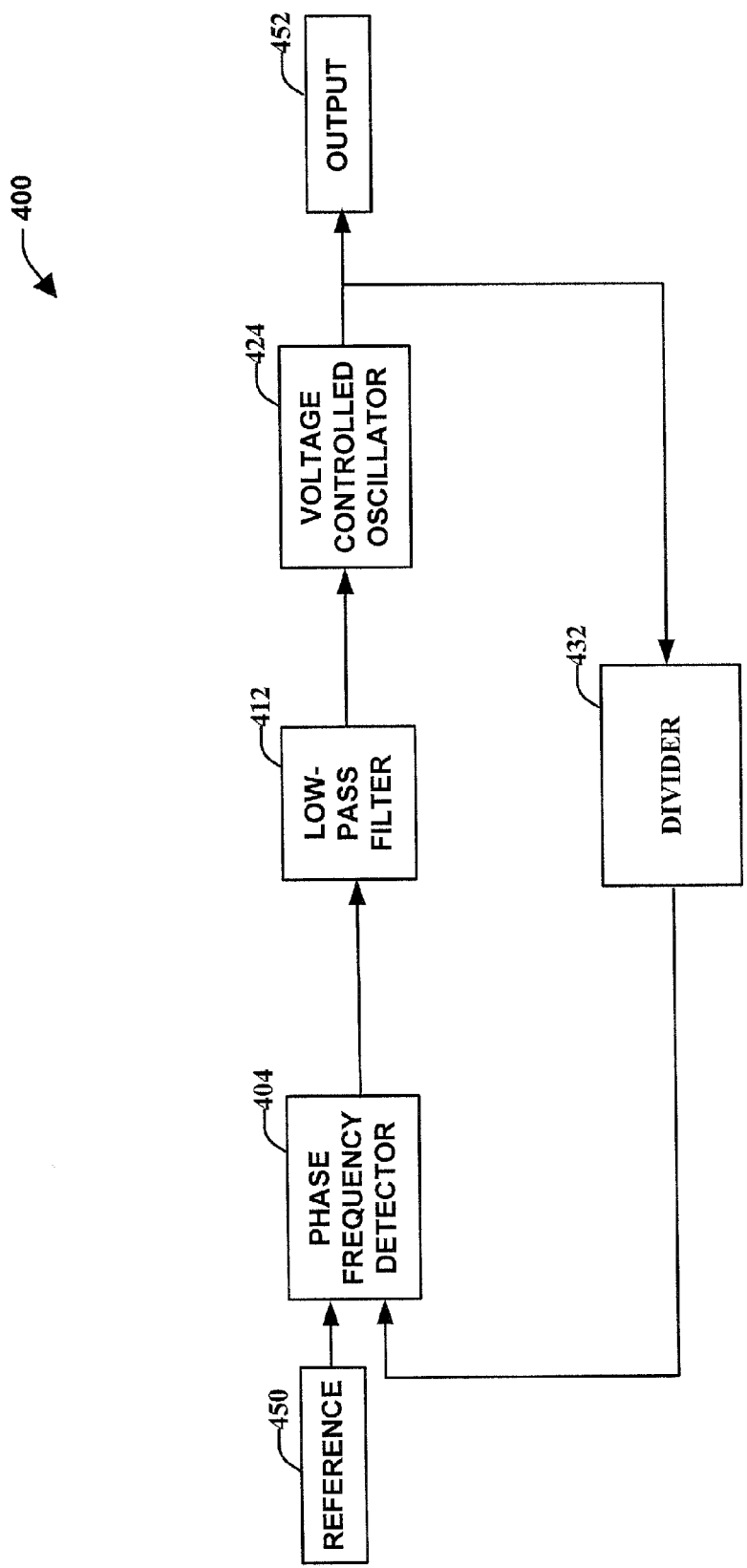
FIG. 4 illustrates an schematic diagram of an example power management system including a phase-locked loop in accordance with various aspects of this disclosure.

Turning now to FIG. 4, there is illustrated a non-limiting exemplary implementation of a frequency regulator system 400 that provides for power management, according to an aspect of this disclosure. The frequency regulator system 400 includes various components in communication with each other, such as on one or more coupled integrated circuits. It is to be appreciated that frequency regulator system 400 can contain various other components not shown here for brevity. The frequency regulator system 400 shows a more detailed view of a portion of a larger power management system capable of scaling and/or synthesizing a frequency. More specifically, the frequency regulator system 400 depicts communication and functionality related to the systems 100, 200, and 300.

The frequency regulator system 400's components can include a phase frequency detector 404, a low-pass filter 412, a voltage controlled oscillator (VCO) 424, and a divider 432. In an aspect, the various components can be configured in a negative feedback loop. In another aspect, the frequency regulator system 400 can comprise various other components such as charge pumps, bias generators, output converters, and the like.

In an implementation, the phased detector 404 can compare two input signals, such as a reference signal 450 and a signal from a divider 432. The phase detector 404 can generate an error signal that is proportional to a phase difference of the two input signals. In one aspect, the reference signal 450 can be a signal representing an input rate. In another aspect, the phase detector 404 can communicated the error signal to the low pass filter 412. The low pass filter can low-pass filter the error signals to the VCO 424. The VCO 424 can generate an output signal 452. The VCO 424 can communicate the output signal 452 to the divider 432 and to various other components, such as a processor, controller, and the like.

In an aspect, the divider 432 can be a divide by N divider, a digital divider, a pulse-swallowing counter, and the like. The divider 432 can be in a negative feedback loop between the VCO 424 and the phase frequency detector 404.

In an implementation, the frequency regulator 400 can synthesize a frequency based on the reference signals. In an aspect, the reference signals can represent an input rate. In another aspect, the frequency regulator 400 can generate the output signals 452 to a target frequency based on the input rate.

Figure 5:
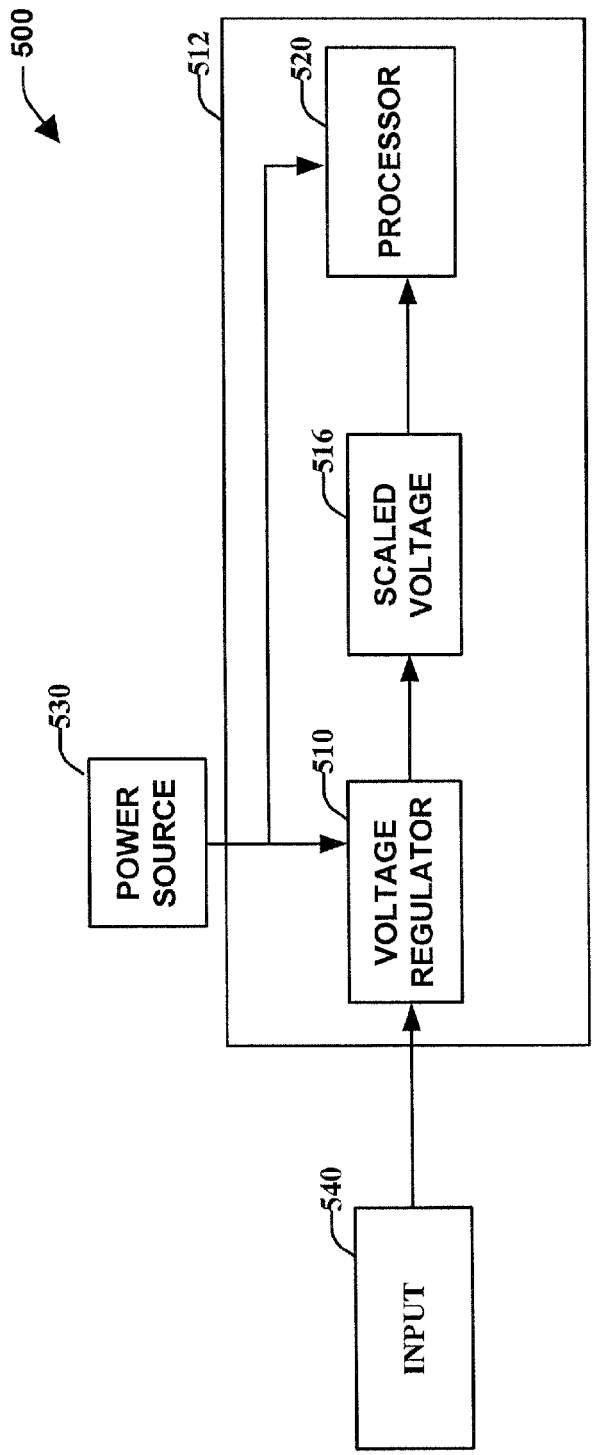
FIG. 5 illustrates a high-level functional block diagram of an example power management system, including a power source in accordance with various aspects of this disclosure.

FIG. 5 shows an example memory system 500 that provides for memory management, according to an aspect of this disclosure. In this embodiment, the system 500 comprises a microchip 502 (e.g., silicon chip comprising integrated circuitry). The microchip 502 comprises a processor 520 coupled to a voltage regulator 510. The processor 520 interacts can interact with a memory controller, software applications in execution, and the like. The voltage regulator 510 is a voltage regulator in accordance with various aspects of this disclosure.

The system 500 is simplified for clarity and readability. It is to be appreciated, however, that the power management system 500 may comprise a frequency regulator, and/or various other components in accordance with various aspects of this disclosure. Similar implementations of the invention may be based on one or more aspects of the system 500.

In an implementation, the voltage regulator 510 can receive voltage from a power source 530. The power source 530 can supply a voltage and the regulator 510 can scale the voltage and communicate the voltage to the processor 520.

In various implementations, the voltage regulator can determined a target voltage based on an input rate of input 540. Additionally or alternatively, that the voltage regulator can determine a target voltage based on various other parameters, such as voltage identification (VID) bits. In an aspect, the voltage regulator 510 can scale a voltage based on the input rate of the input to adjust a scaled voltage 516. As an example, during an idle and/or relatively idle period of a relatively reduced input rate, the voltage regulator 510 can reduce power consumption by the processor 520.

As an example, a larger system (e.g., computer, motherboard, etc.) can comprise one or more implementations of the system 500. As such, one or more processors can utilize the power source 530. In an aspect, the power source 530 can generate a voltage that is relatively larger than required by the one or more systems 500. Voltage regulators, such as the voltage regulator 510, can adjust a voltage for respective processors.

Figure 6:
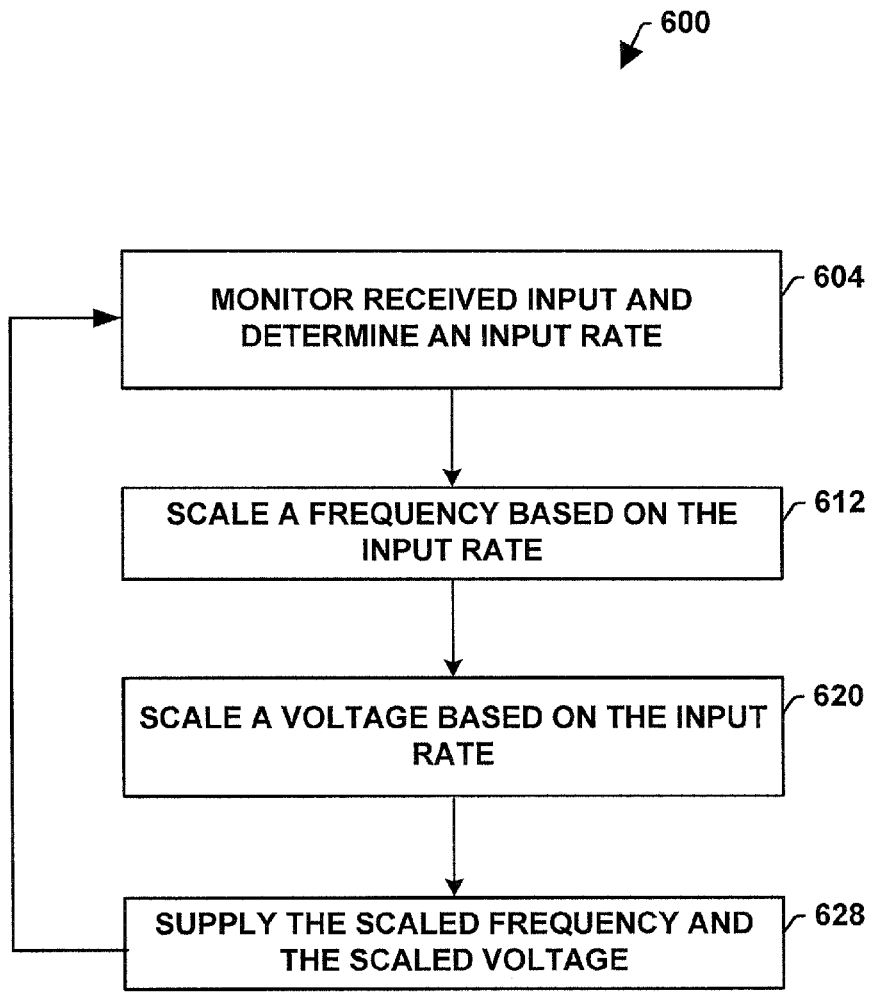
FIG. 6 illustrates an example methodology for managing power consumption in accordance with various aspects of this disclosure.
Figure 7:
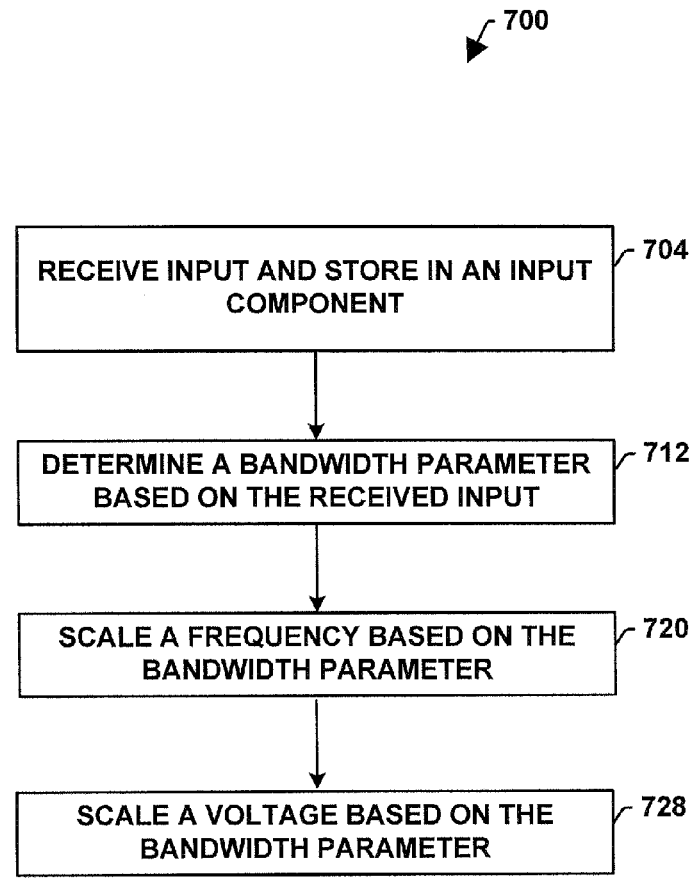
FIG. 7 illustrates an example methodology for managing power consumption including determining a bandwidth parameter in accordance with various aspects of this disclosure.
Figure 8:
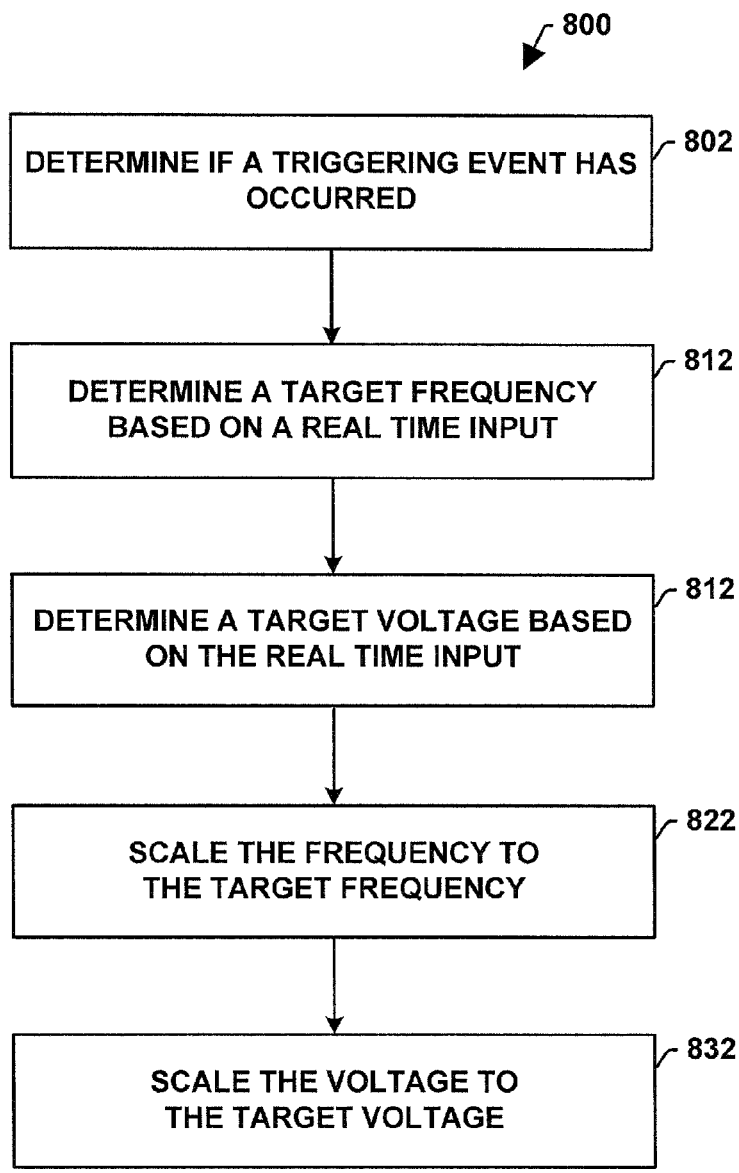
FIG. 8 illustrates an example methodology managing power consumption upon determining a triggering even has occurred accordance with various aspects of this disclosure.

Referring now to FIGS. 6-8, there are illustrated methodologies and/or flow diagrams in accordance with the disclosed subject matter. For simplicity of explanation, the methodologies are depicted and described as a series of acts. However, acts in accordance with this disclosure can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer readable device or storage medium, integrated circuits containing various electrical components, and electronic devices.

With reference to FIG. 6, there is illustrated a methodology 600 for managing a memory device upon receiving a request, according to an aspect of this disclosure. As an example, various electronic devices, such as, but not limited to, memory storage systems, server systems, personal computers, cellular phones, consumer electronic and other electronic systems can utilize methodology 600. Specifically, methodology 600 manages power consumption of variable input rate device(s).

A power management system monitors received input and determines an input rate (e.g., via a power management component 112) at 604. For example, one or more computer applications can issue requests to a power management system and the power management system can monitor the requests.

At 612, a power management system can scale a frequency based on the input rate (e.g., via frequency regulator 136, 236, 336, and the like). For example, a frequency regulator can determine a target frequency based on an input rate and can alter a frequency to the target frequency. In an aspect, the target frequency can be determined via various power management techniques, look up tables, and the like.

Turning to 620, a power management system scales a violated based on the input rate (e.g., via voltage regulator 120, 220, 320, etc.). In one aspect, a voltage is scaled to a target voltage. A target voltage can be determined via various power management techniques, look up tables, and the like. In various implementations, the target voltage can be further determined as a function of the input rate and system parameters (e.g., VID).

At 628, a power management system can communicate a scaled frequency and/or scaled voltage (e.g., such as to a processor). It is noted that the methodology can be iterated continuously. Accordingly, methodology 600 can increase efficiency in power management systems.

With reference to FIG. 7, there is illustrated a methodology 700 for managing a power consumption of a device upon receiving input in a buffer, according to an aspect of this disclosure. As an example, various electronic devices, such as, but not limited to, memory storage systems, server systems, personal computers, cellular phones, consumer electronic and other electronic systems can utilize methodology 700. Specifically, methodology 700 scales a frequency and a voltage utilized to provide power to a processor device.

A power management system can receive input (e.g., one or more requests) and store the input in a buffer at 704. For example, a plurality of devices, applications, and the like can send requests to a power management device. In an example, requests can be sent via a network (e.g., internet, cellular network, satellite and/or ethernet). In another aspect, the set of requests can be stored in queues, tables, and/or the like of a buffer.

At 712, a power management system can determine a bandwidth parameter based on the input (e.g., input rate, bandwidth requirement, etc). In an example, bandwidth parameter can be a measurement of resource needs.

At 720, a power management system can scale a frequency based on a bandwidth parameter (e.g., via the frequency regulator 400). In one embodiment, a power management system can scale the frequency on a fine grain scale in real time, and/or near real time.

At 728, a power management system can scale a voltage based on a bandwidth parameter (e.g., via the voltage regulator 510). In one embodiment, a power management system can scale the voltage on a fine grain scale in real time, and/or near real time.

With reference to FIG. 8, there is illustrated a methodology 800 for managing power in a variable input rate device, according to an aspect of this disclosure (e.g., via system 100). As an example, various electronic devices, such as, but not limited to, memory storage systems, server systems, personal computers, cellular phones, consumer electronic and other electronic systems can utilize methodology 800. Specifically, methodology 800 determines target frequencies and/or voltages based on real time input.

At 804, a power management system can determine if a triggering event has occurred. For example, a power management system can monitor input and/or various system components to determine if a triggering even has occurred.

Turning to 812, a power management system can determine if a request is marked for a BOT or SOT request (e.g., via SOTID CAM 448 and BOTID CAM 452). For example, a memory system can determine an association between a request and a BOT or an SOT. The determination is used to send a request to the respective table.

At 820, a power management system can determine a target frequency based on an input. In an example, a target frequency can be based on a real time (and/or near real time) input. For example, a target frequency can be determined based on an instantaneous input rate.

Turning to 828, a power management system can determine a target voltage based on an input. In an example, a target voltage can be based on a real time (and/or near real time) input. For example, a target voltage can be determined based on an instantaneous input rate.

At 836, a power management system can scale a frequency based on the target frequency. In an example, scaling a frequency can include altering (and/or generating) a frequency and supplying the frequency to a system component (e.g., the processor 246.

At 842, a power management system can scale a voltage based on the target voltage. In an example, scaling a voltage can include altering a voltage and supplying the voltage to a system component (e.g., the processor 246.

The systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders that are not all of which may be explicitly illustrated herein.

Figure 9:
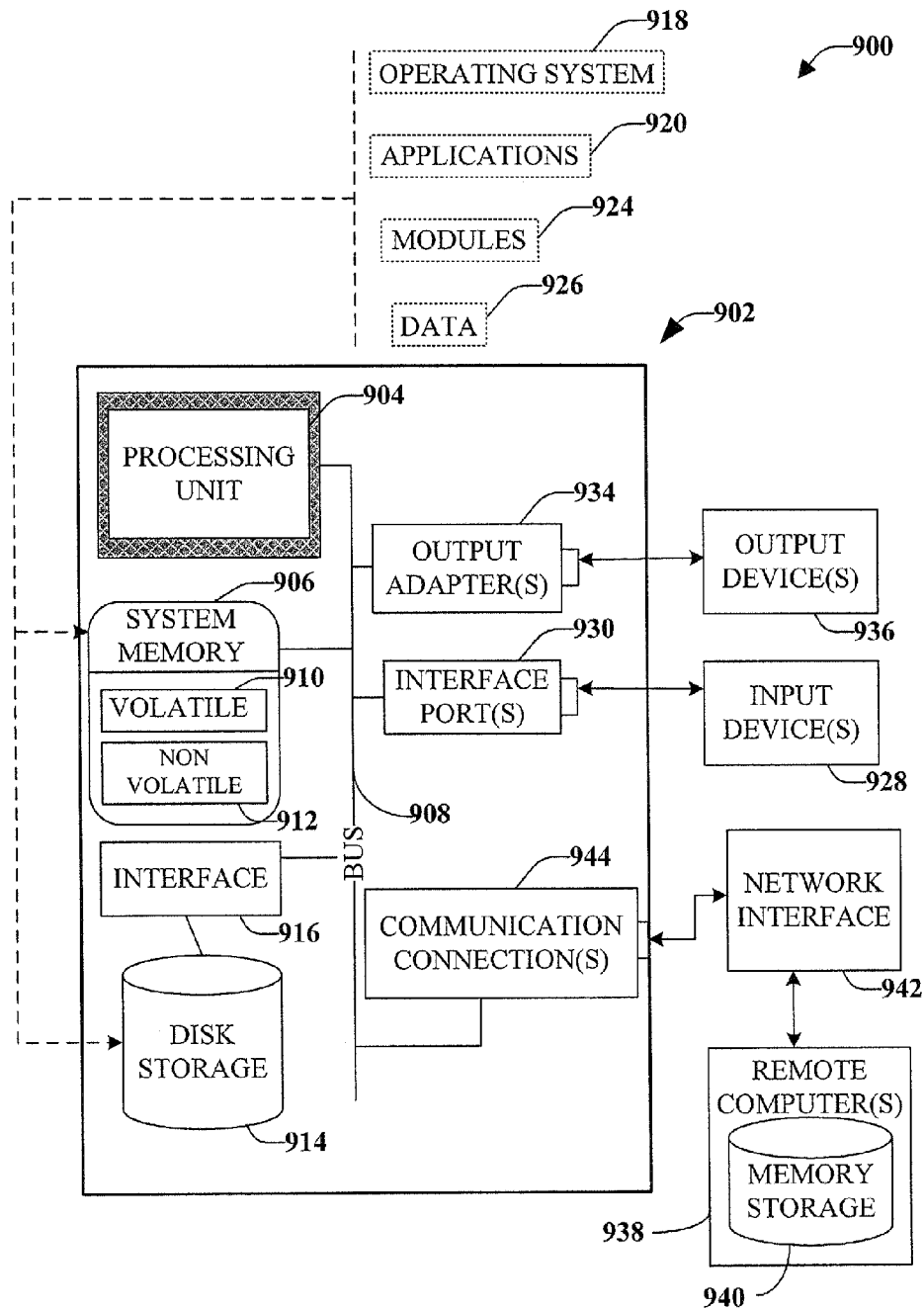
FIG. 9 illustrates an example schematic block diagram of a computing environment in accordance various aspects of this disclosure.

Referring now to FIG. 9, there is illustrated a schematic block diagram of a computing environment 900 in accordance with this specification. The system 900 includes one or more client(s) 902, (e.g., computers, smart phones, tablets, cameras, PDA's). The client(s) 902 can be hardware and/or software (e.g., threads, processes, computing devices). The client(s) 902 can house cookie(s) and/or associated contextual information. The client(s) 902 can include one more power management systems in accordance with aspects of this disclosure. For example, a client 902 can perform tasks and manage a power consumption in a system.

The system 900 also includes one or more server(s) 904. The server(s) 904 can also be hardware or hardware in combination with software (e.g., threads, processes, computing devices). The server(s) 904 can house threads to perform transformations, for example. The server(s) 904 can also include various power management systems capable of identifying scaling voltages and/or frequencies in accordance with this disclosure. One possible communication between a client 902 and a server 904 can be in the form of a data packet adapted to be transmitted between two or more computer processes wherein data may be accessed or stored in accordance with aspects of this disclosure. The data packet can include a cookie and/or associated contextual information, for example. The system 900 includes a communication framework 906 (e.g., a global communication network such as the Internet) that can be employed to facilitate communications between the client(s) 902 and the server(s) 904.

Communications can be facilitated via a wired (including optical fiber) and/or wireless technology. The client(s) 902 are operatively connected to one or more client data store(s) 908 that can be employed to store information local to the client(s) 902 (e.g., cookie(s) and/or associated contextual information). Similarly, the server(s) 904 are operatively connected to one or more server data store(s) 910 that can be employed to store information local to the servers 904.

In one implementation, a client 902 can transfer data or requests to a server 904. Server 904 can store the data, perform requests, or transmit the data or request to another client 902 or server 904. At various stages, system 900 can implement power management systems in accordance with this disclosure. For example, the client(s) 902 and the server(s) 904 can each implement one or more power management systems in accordance with this disclosure.

Figure 10:
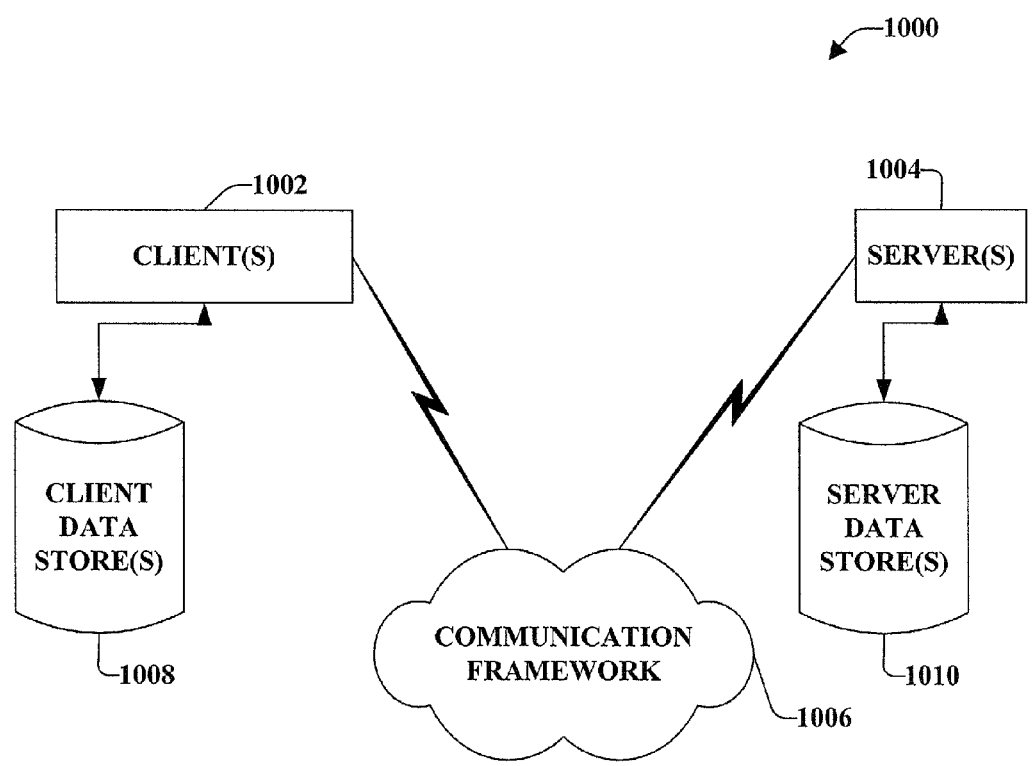
FIG. 10 illustrates an example block diagram of a computer operable to execute various aspects of this disclosure.

With reference to FIG. 10, a suitable environment 1000 for implementing various aspects of the claimed subject matter includes a computer 1002. The computer 1002 includes a processing unit 1004, a system memory 1006, a codec 1005, and a system bus 1008. The system bus 1008 couples system components including, but not limited to, the system memory 1006 to the processing unit 1004. The processing unit 1004 can be any of various available processors. Dual microprocessors and other multiprocessor architectures also can be employed as the processing unit 1004.

The system bus 1008 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1006 can include volatile memory 1010 and non-volatile memory 1012. The basic input/output system (BIOS), containing the basic routines to transfer information between elements within the computer 1002, such as during start-up, is stored in non-volatile memory 1012. By way of illustration, and not limitation, non-volatile memory 1012 can include read only memory (ROM), programmable ROM (PROM), electrically programmable ROM (EPROM), electrically erasable programmable ROM (EEPROM), or flash memory. Volatile memory 1010 includes random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDRx SDRAM), and enhanced SDRAM (ESDRAM).

Computer 1002 may also include removable/non-removable, volatile/non-volatile computer storage media. FIG. 10 illustrates, for example, a disk storage 1014. Disk storage 1014 includes, but is not limited to, devices like a magnetic disk drive, solid state disk (SSD) floppy disk drive, tape drive, Zip drive, LS-100 drive, flash memory card, or memory stick. In addition, disk storage 1014 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1014 to the system bus 1008, a removable or non-removable interface is typically used, such as interface 1016.

It is to be appreciated that FIG. 10 describes software, software in execution, hardware, and/or software in combination with hardware that acts as an intermediary between users and the basic computer resources described in the suitable operating environment 1000. Such software includes an operating system 1018. Operating system 1018, which can be stored on disk storage 1014, acts to control and allocate resources of the computer system 1002. Applications 1020 take advantage of the management of resources by operating system 1018 through program modules 1024, and program data 1026, such as the boot/shutdown transaction table and the like, stored either in system memory 1006 or on disk storage 1014. It is to be appreciated that the claimed subject matter can be implemented with various operating systems or combinations of operating systems. For example, applications 1020 and program data 1026 can include software implementing aspects of this disclosure.

A user enters commands or information into the computer 1002 through input device(s) 1028. Input devices 1028 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1004 through the system bus 1008 via interface port(s) 1030. Interface port(s) 1030 include, for example, a serial port, a parallel port, a game port, and a universal serial bus (USB). Output device(s) 1036 use some of the same type of ports as input device(s) 1028. Thus, for example, a USB port may be used to provide input to computer 1002, and to output information from computer 1002 to an output device 1036. Output adapter 1034 is provided to illustrate that there are some output devices 1036 like monitors, speakers, and printers, among other output devices 1036, which require special adapters. The output adapters 1034 include, by way of illustration and not limitation, video and sound cards that provide a means of connection between the output device 1036 and the system bus 1008. It should be noted that other devices and/or systems of devices provide both input and output capabilities such as remote computer(s) 1038.

Computer 1002 can operate in a networked environment using logical connections to one or more remote computers, such as remote computer(s) 1038. The remote computer(s) 1038 can be a personal computer, a server, a router, a network PC, a workstation, a microprocessor based appliance, a peer device, a smart phone, a tablet, or other network node, and typically includes many of the elements described relative to computer 1002. For purposes of brevity, only a memory storage device 1040 is illustrated with remote computer(s) 1038. Remote computer(s) 1038 is logically connected to computer 1002 through a network interface 1042 and then connected via communication connection(s) 1044. Network interface 1042 encompasses wire and/or wireless communication networks such as local-area networks (LAN), wide-area networks (WAN), and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1044 refers to the hardware/software employed to connect the network interface 1042 to the bus 1008. While communication connection 1044 is shown for illustrative clarity inside computer 1002, it can also be external to computer 1002. The hardware/software necessary for connection to the network interface 1042 includes, for exemplary purposes only, internal and external technologies such as, modems including regular telephone grade modems, cable modems and DSL modems, ISDN adapters, wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules can be located in both local and remote memory storage devices.

Moreover, it is to be appreciated that various components described herein can include electrical circuit(s) that can include components and circuitry elements of suitable value in order to implement the implementations of this innovation (s), optical devices, and/or mechanical devices in order to implement the implementations of this innovation(s). Furthermore, it can be appreciated that many of the various components can be implemented on one or more integrated circuit (IC) chips. For example, in one implementation, a set of components can be implemented in a single IC chip. In other implementations, one or more of respective components are fabricated or implemented on separate IC chips.

What has been described above includes examples of the implementations of the present invention. It is, of course, not possible to describe every conceivable combination of components or methodologies for purposes of describing the claimed subject matter, but it is to be appreciated that many further combinations and permutations of this innovation are possible, including various systems and methods employing power management systems and for methods. Accordingly, the claimed subject matter is intended to embrace all such alterations, modifications, and variations that fall within the spirit and scope of the appended claims. Moreover, the above description of illustrated implementations of this disclosure, including what is described in the Abstract, is not intended to be exhaustive or to limit the disclosed implementations to the precise forms disclosed. While specific implementations and examples are described herein for illustrative purposes, various modifications are possible that are considered within the scope of such implementations and examples, as those skilled in the relevant art can recognize.

In particular and in regard to the various functions performed by the above described components, devices, circuits, systems and the like, the terms used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter. In this regard, it will also be recognized that the innovation includes a system as well as a computer-readable storage medium having computer-executable instructions for performing the acts and/or events of the various methods of the claimed subject matter.

The aforementioned systems/circuits/modules have been described with respect to interaction between several components/blocks. It can be appreciated that such systems/circuits and components/blocks can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it should be noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but known by those of skill in the art.

In addition, while a particular feature of this innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

Reference throughout this specification to "one implementation" or "an implementation" or "one embodiment" or "an embodiment" means that a particular feature, structure, or characteristic described in connection with the implementation is included in at least one implementation or at least one embodiment. Thus, the appearances of the phrase "in one implementation" or "in an implementation" or "in one embodiment" or "in an embodiment" in various places throughout this specification are not necessarily all referring to the same implementation/embodiment. Furthermore, the particular features, structures, or characteristics may be combined in any suitable manner in one or more implementations/ embodiments.

Further, references throughout this specification to an "item," or "file," means that a particular structure, feature or object described in connection with the implementations are not necessarily referring to the same object. Furthermore, a "file" or "item" can refer to an object of various formats.

As used in this application, the terms "component," "module," "system," or the like are generally intended to refer to a computer-related entity, either hardware (e.g., a circuit), a combination of hardware and software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers. While separate components are depicted in various implementations, it is to be appreciated that the components may be represented in one or more common component. Further, design of the various implementations can include different component placements, component selections, etc., to achieve an optimal performance. Further, a "device" can come in the form of specially designed hardware; generalized hardware made specialized by the execution of software thereon that enables the hardware to perform specific function (e.g., data storage and retrieval); software stored on a computer readable medium; or a combination thereof.

Moreover, the words "example" or "exemplary" are used herein to mean serving as an example, instance, or illustration. Any aspect or design described herein as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What is claimed is:

1. A device configured for dynamic power management, comprising:
   an input component configured to receive input from at least one computer processor;
   a voltage regulator component configured to scale a voltage according to the input; and
   a frequency regulator component configured to determine a target frequency level as a multiple of a first frequency of the input and to alter a second frequency according to the target frequency level.

2. The device of claim 1, wherein the input component is further configured to determine an occurrence of a triggering event.

3. The device of claim 2, wherein at least one of the frequency regulator component or the voltage regulator component is further configured to automatically scale at least one of the frequency or the voltage based on the input component determining that the triggering event has occurred.

4. The device of claim 3, wherein the triggering event comprises at least one of a change in an input rate of the input or a passage of an interval.

5. The device of claim 1, wherein the input component is further configured to determine an input rate of the input.

6. The device of claim 1, wherein the voltage regulator component is further configured to determine a target voltage level based on the input and alter the voltage according to the target voltage level.

7. The device of claim 1, wherein at least one of the voltage regulator component or the frequency regulator component is further configured to at least one of scale the voltage transparent of a software application or scale the frequency transparent of the software application.

8. The device of claim 1, wherein the device is a variable input rate device.

9. A method of managing power consumption, comprising:
   monitoring, by a system comprising a processor, a received input;
   scaling, by the system, a voltage based on the received input;
   determining, by the system, a target frequency level as a multiple of a first frequency of the input; and
   scaling, by the system, a second frequency to the target frequency level.

10. The method of claim 9, wherein the monitoring the received input further comprises determining an input rate of the received input.

11. The method of claim 9, further comprising determining a bandwidth parameter.

12. The method of claim 11, wherein the scaling the voltage further comprises scaling the voltage based on the received input and the bandwidth parameter.

13. The method of claim 11, wherein the scaling the second frequency further comprises scaling the frequency based on the received input and the bandwidth parameter.

14. The method of claim 9, further comprising:
   determining a target voltage based on the input; and
   scaling the voltage to the target voltage.

15. The method of claim 9, further comprising identifying an occurrence of a triggering event, wherein the scaling the voltage comprises scaling the voltage in response to the identifying.

16. The method of claim 9, further comprising identifying an occurrence of a triggering event, wherein the scaling the second frequency comprises scaling the second frequency in response to the identifying.

17. A system for power management, comprising:
   a first circuit for determining an input rate;
   a second circuit for scaling a voltage as a function of the input rate; and
   a third circuit for determining a target frequency level as a multiple of a first frequency of the input rate and scaling a second frequency to the target frequency level.

18. The system of claim 17, further comprising a fourth circuit for determining a target voltage.

19. The system of claim 17, further comprising a fourth circuit for determining a triggering event.

20. The system of claim 19, wherein the first circuit for determining the input rate determines the input rate, the second circuit for scaling the voltage scales the voltage, and means the third circuit for scaling the second frequency scales the second frequency in response to the fourth circuit for determining the triggering event determining that the triggering event has occurred.

* * * * *